US011632013B2

(12) United States Patent
Hayashi et al.

(10) Patent No.: US 11,632,013 B2
(45) Date of Patent: Apr. 18, 2023

(54) CONTROL DEVICE AND MOTOR DEVICE THAT ENSURE HEAT DISSIPATION WHILE REDUCING THE SIZE OF THE MOTOR DEVICE

(71) Applicant: JTEKT CORPORATION, Osaka (JP)

(72) Inventors: Yuki Hayashi, Okazaki (JP); Yuto Sato, Nagoya (JP)

(73) Assignee: JTEKT CORPORATION, Kariya (JP)

( * ) Notice: Subject to any disclaimer, the term of this patent is extended or adjusted under 35 U.S.C. 154(b) by 213 days.

(21) Appl. No.: 17/039,291

(22) Filed: Sep. 30, 2020

(65) Prior Publication Data

US 2021/0111608 A1   Apr. 15, 2021

(30) Foreign Application Priority Data

Oct. 11, 2019  (JP) .............................. JP2019-187918

(51) Int. Cl.
*H02K 5/22* (2006.01)
*H02K 9/22* (2006.01)
*H02K 11/33* (2016.01)

(52) U.S. Cl.
CPC ............... *H02K 5/225* (2013.01); *H02K 9/22* (2013.01); *H02K 11/33* (2016.01); *H02K 2211/03* (2013.01)

(58) Field of Classification Search
CPC ............ H02K 5/22; H02K 5/225; H02K 9/22; H02K 9/227; H02K 11/30; H02K 11/33; H02K 2211/03
See application file for complete search history.

(56) References Cited

U.S. PATENT DOCUMENTS 6,317,324 B1    11/2001  Chen et al.
2005/0190539 A1*  9/2005  Watanabe .......... H05K 7/20854
                                                   361/704

(Continued)

FOREIGN PATENT DOCUMENTS

JP      2008-041893 A    2/2008
JP      2017-189033 A   10/2017
WO   WO-2019070068 A1 *  4/2019  ............... B62D 5/04

OTHER PUBLICATIONS

Feb. 23, 2021 Search Report issued in European Patent Application No. 20200542.7.

*Primary Examiner* — Eric Johnson
(74) *Attorney, Agent, or Firm* — Oliff PLC

(57) ABSTRACT

A control device includes a first substrate provided with a chip electronic component; a second substrate having a surface provided with electronic components including a tall component taller than the chip electronic component, the surface of the second substrate facing a surface of the first substrate that is provided with the chip electronic component; and a heat sink disposed between the first substrate and the second substrate. The heat sink includes a component receiving portion and a heat dissipation portion, the component receiving portion being configured to receive the tall component, the heat dissipation portion being configured to perform heat exchange between the first substrate and the second substrate, and the component receiving portion and the heat dissipation portion being provided so as not to overlap with each other as viewed in a facing direction in which the first substrate and the second substrate face each other.

4 Claims, 7 Drawing Sheets

(56) References Cited

U.S. PATENT DOCUMENTS

| | | | |
|---|---|---|---|
| 2013/0069454 A1* | 3/2013 | Motoda | H02K 11/33 310/68 R |
| 2013/0088128 A1* | 4/2013 | Nakano | H05K 7/20854 361/709 |
| 2013/0099611 A1* | 4/2013 | Suga | H02K 5/225 310/71 |
| 2017/0019029 A1 | 1/2017 | Gekinozu et al. | |
| 2017/0291635 A1* | 10/2017 | Yamasaki | H02P 6/16 |
| 2019/0103788 A1* | 4/2019 | Iwasaki | H02K 11/27 |
| 2019/0276072 A1 | 9/2019 | Morimoto et al. | |

* cited by examiner

CONTROL DEVICE AND MOTOR DEVICE THAT ENSURE HEAT DISSIPATION WHILE REDUCING THE SIZE OF THE MOTOR DEVICE

CROSS-REFERENCE TO RELATED APPLICATION

This application claims priority to Japanese Patent Application No. 2019-187918 filed on Oct. 11, 2019, incorporated herein by reference in its entirety.

BACKGROUND

1. Technical Field

The disclosure relates to a control device and a motor device.

2. Description of Related Art

There has been a motor device including a motor and its control device that are provided integrally with each other. For example, in Japanese Unexamined Patent Application Publication No. 2017-189033 (JP 2017-189033 A), a control device is disposed at an end portion of a motor. The control device includes two substrates that face each other and that are perpendicular to the axial direction of the motor, and a heat sink disposed between the two substrates. The two substrates are provided with various electronic components that operate by consuming the electric power, and the heat generated by these electronic components is dissipated through the heat sink.

For example, in the first substrate on the motor-side, its first surface on the side opposite to the heat sink is provided with switching elements forming an inverter circuit, and its second surface on the heat sink-side is provided with a capacitor and a microcomputer. The height of the capacitor from the substrate is greater than the height of the microcomputer from the substrate, and therefore, the capacitor is received in a recess formed in the heat sink so that the interference between the capacitor and the heat sink is avoided. The microcomputer is held in contact with the heat sink.

SUMMARY

While motor devices are used as drive sources for various installed objects, there are cases where, depending on the installed object, the size of the motor device is required to be reduced so as to ensure an installation space for the motor device.

The disclosure provides a control device and a motor device that each make it possible to reduce the size while ensuring the heat dissipation.

A control device according to a first aspect of the disclosure includes a first substrate provided with a chip electronic component; a second substrate having a surface provided with a plurality of electronic components including a tall component taller than the chip electronic component, the surface of the second substrate facing a surface of the first substrate, and the surface of the first substrate being provided with the chip electronic component; and a heat sink disposed between the first substrate and the second substrate. The heat sink includes a component receiving portion and a heat dissipation portion, the component receiving portion being configured to receive the tall component on the second substrate, the heat dissipation portion being configured to perform heat exchange between the first substrate and the second substrate, and the component receiving portion and the heat dissipation portion being provided so as not to overlap with each other as viewed in a facing direction in which the first substrate and the second substrate face each other.

With this configuration, the tall component on the second substrate is received in the component receiving portion of the heat sink. Therefore, the interference between the tall component on the second substrate and the heat sink is avoided. Further, by providing the heat sink between the first substrate and the second substrate, the heat generated by the first substrate and the heat generated by the second substrate are properly dissipated through the heat sink. Further, the component receiving portion and the heat dissipation portion are provided so as not to overlap with each other as viewed in the facing direction in which the first substrate and the second substrate face each other. Therefore, there is no need to perform heat exchange between a portion corresponding to the component receiving portion in the heat sink and the first substrate. Consequently, the thickness of a portion of the heat sink on the first substrate-side, i.e. on the side opposite to the side where the tall component is inserted into the component receiving portion, can be reduced so that the dimension of the heat sink in the facing direction in which the first substrate and the second substrate face each other can be shortened correspondingly.

In the control device according to the first aspect, the component receiving portion may extend through the heat sink in the facing direction in which the first substrate and the second substrate face each other. As described above, there is no need to perform heat exchange between the portion corresponding to the component receiving portion in the heat sink and the first substrate. Therefore, there is no need to cause the portion corresponding to the component receiving portion in the heat sink to contact with the first substrate. Consequently, it is possible to employ the configuration in which the component receiving portion extends through the heat sink as described above. Since the thickness of the portion of the heat sink, which is located on the first substrate-side, can be further reduced, the dimension of the heat sink in the facing direction in which the first substrate and the second substrate face each other can be further shortened.

In the control device according to the first aspect, the component receiving portion may be provided in a central portion of the heat sink, and the heat dissipation portion may be provided in a peripheral portion around the component receiving portion in the heat sink.

With this configuration, as compared to a case where the heat dissipation portion is provided in the central portion of the heat sink, the distance between the heat dissipation portion and the air outside the control device is shortened. Therefore, the heat transferred to the heat dissipation portion is dissipated to the air more quickly. Consequently, the heat dissipation effect of the heat sink can be further enhanced.

In the control device according to the first aspect, the heat sink may include a partition wall and a peripheral wall, the partition wall being located between the first substrate and the second substrate, and the peripheral wall being provided on a peripheral edge portion of the partition wall and surrounding both the first substrate and the second substrate.

With this configuration, the heat generated by the first substrate and the heat generated by the second substrate are dissipated through the partition wall and the peripheral wall. Since the contact area between the heat sink and the air is ensured by providing the peripheral wall in the heat sink, the heat dissipation effect of the heat sink is further enhanced. Further, the first substrate and the second substrate are protected from dust, shock, or the like by the peripheral wall.

In the control device according to the first aspect, the first substrate may be configured to control supply of electric power to an electrical device, and the second substrate may be configured to supply the electric power to the electrical device through control performed by the first substrate. In this case, the second substrate may be located closer to the electrical device than the first substrate is.

With this configuration, since the second substrate that supplies the electric power to the electrical device is provided at the position closer to the electrical device, the power supply distance from the second substrate to the electrical device can be shortened.

In the control device according to the first aspect, a terminal block to which a terminal of the electrical device is connected may be provided on the surface of the second substrate, the surface of the second substrate being provided with the tall component. In this case, the heat sink may include a terminal block receiving portion configured to receive the terminal block, the terminal block receiving portion being provided so as not to overlap with the component receiving portion or the heat dissipation portion as viewed in the facing direction in which the first substrate and the second substrate face each other.

With this configuration, since the terminal block is received in the terminal block receiving portion, as compared to a case where the terminal block is provided on a side of the second substrate, which is opposite to the tall component, the dimension of the control device in the facing direction in which the first substrate and the second substrate face each other can be shortened.

A motor device according to a second aspect of the disclosure includes the control device according to the first aspect and a motor as an electrical device, the motor being provided integrally with the control device. The control device according to the first aspect is suitable as a control device for the motor.

With the control device and the motor device according to the first and second aspects of the disclosure, it is possible to reduce the size while ensuring the heat dissipation.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
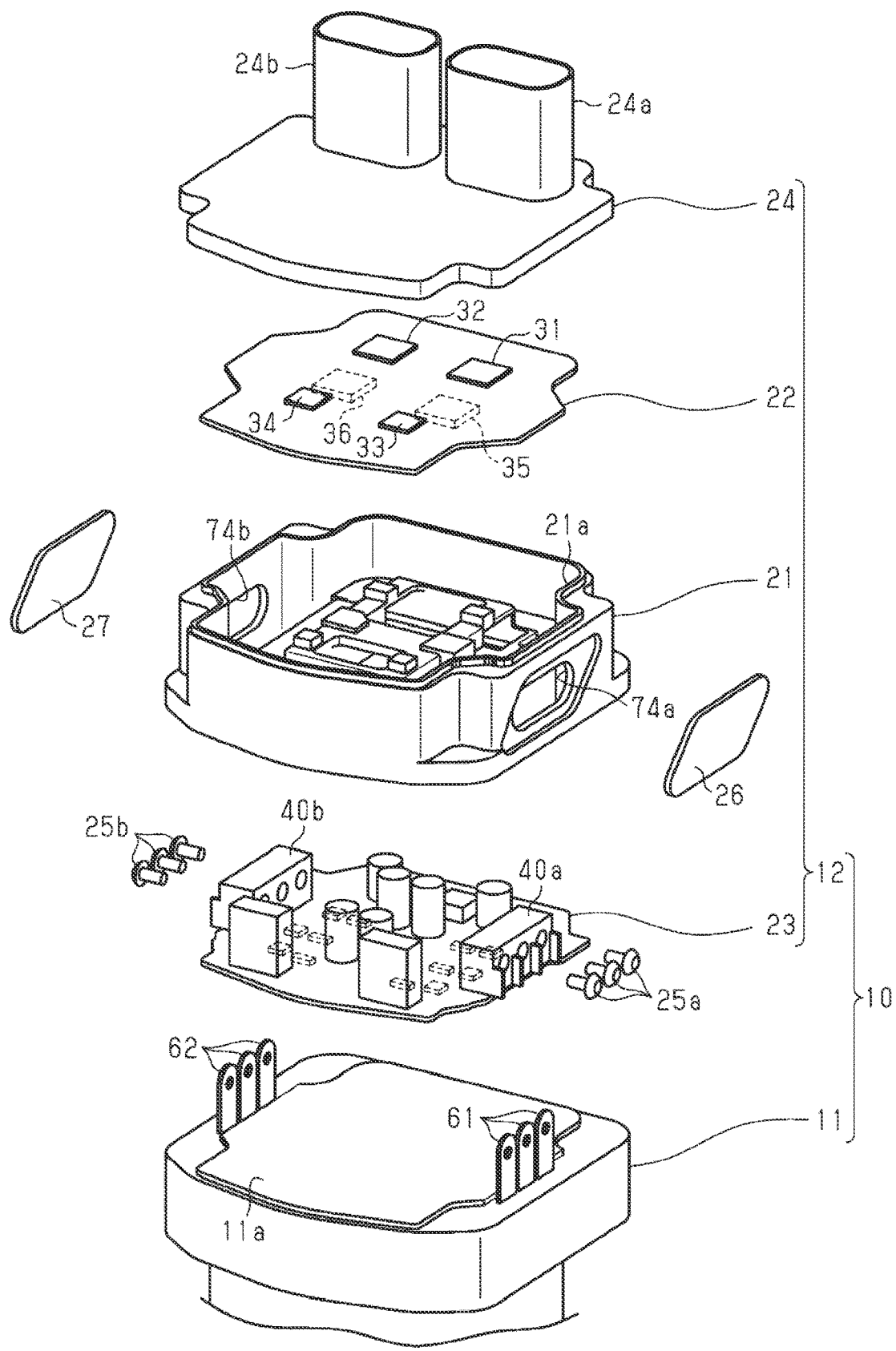
FIG. 1 is an exploded perspective view of a motor device including a control device according to an embodiment.

Hereinafter, a description will be provided on an embodiment in which a control device is embodied in a motor device. As illustrated in FIG. 1, a motor device 10 includes a motor 11 and a control device 12. A three-phase brushless motor, for example, is employed as the motor 11. The motor 11 has winding groups of two systems. The control device 12 is disposed at an end portion of the motor 11. The control device 12 controls the supply of electric power to the winding groups of the two systems in the motor 11 independently per system.

The control device 12 includes a heat sink 21, a first substrate 22, a second substrate 23, and a cover 24. The heat sink 21, the first substrate 22, the second substrate 23, and the cover 24 are assembled into a subassembly. The control device 12 as this subassembly is attached to the end portion of the motor 11.

Figure 2:
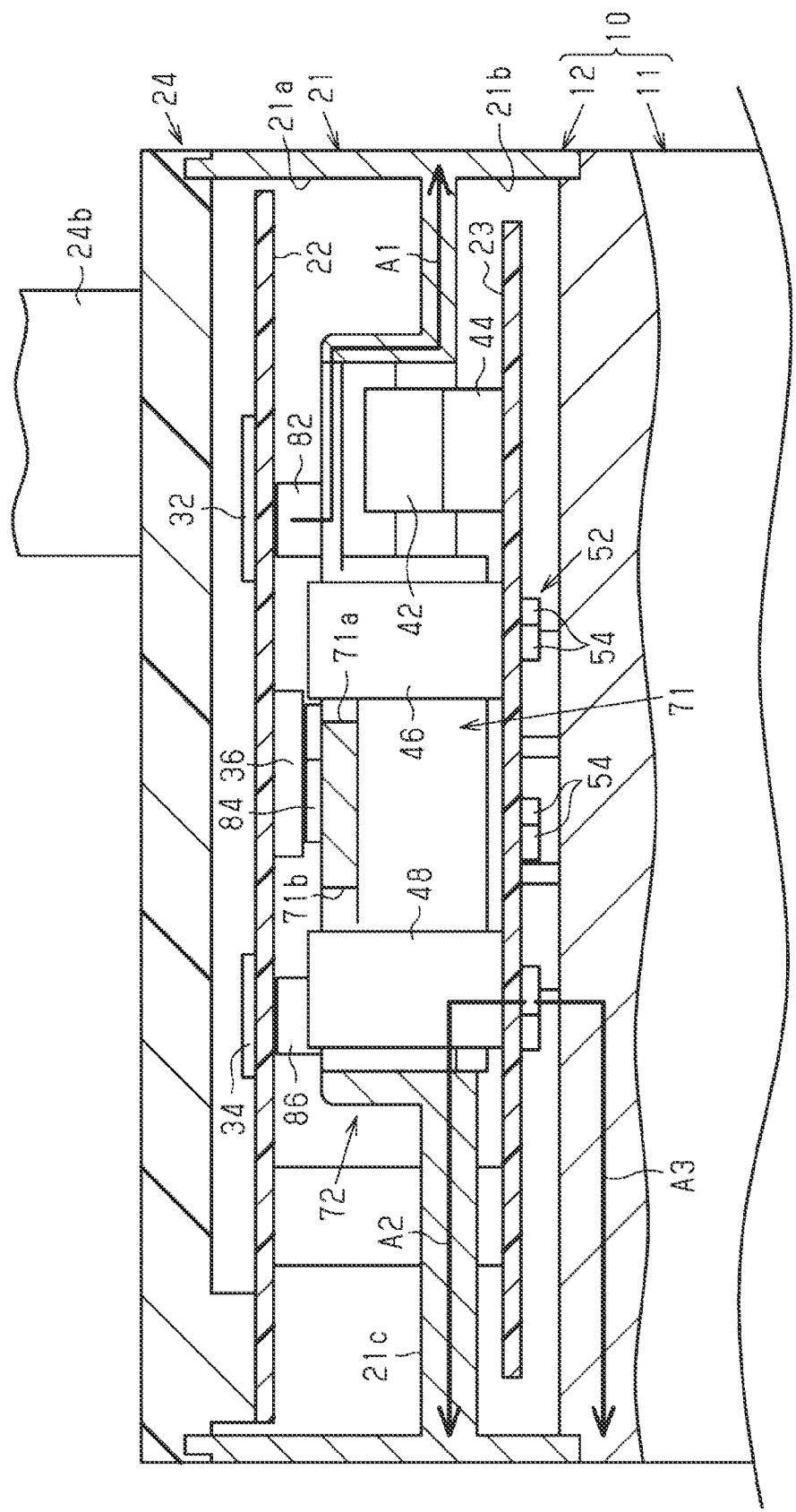
FIG. 2 is a sectional view of a main part of the motor device including the control device according to the embodiment.

As illustrated in FIG. 2, the heat sink 21 is fixed to the end portion of the motor 11. The heat sink 21 is made of a metal material, such as aluminum, excellent in thermal conductivity. The heat sink 21 includes a first substrate housing portion 21*a* and a second substrate housing portion 21*b*. The first substrate housing portion 21*a* is open at a side surface of the heat sink 21, which is located on the side opposite to the motor 11 (i.e., on the upper side in FIG. 2). The second substrate housing portion 21*b* is open at a side surface of the heat sink 21, which is located on the motor 11-side (i.e., on the lower side in FIG. 2).

As illustrated in FIG. 2, the first substrate 22 is housed in the first substrate housing portion 21*a* of the heat sink 21. The first substrate 22 is fixed to the cover 24. The first substrate 22 is provided with electronic components configured to control the supply of electric power to the motor 11. The first substrate 22 is a so-called control substrate.

Figure 3:
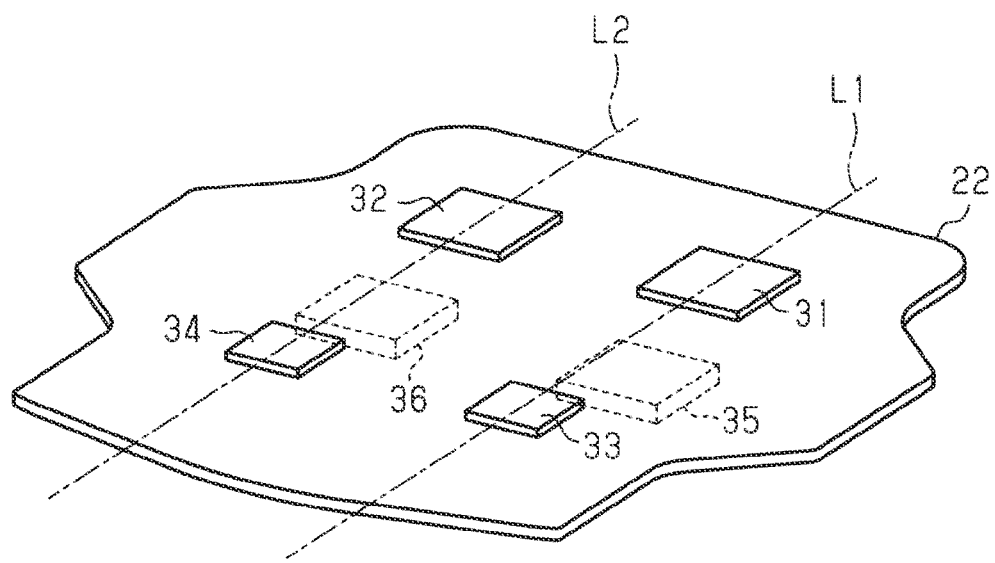
FIG. 3 is a perspective view of a first substrate in the embodiment.

As illustrated in FIG. 3, a plurality of (herein, four) chip electronic components 31 to 34 such as integrated circuits corresponding to the winding groups of the two systems is mounted on a first surface (an upper surface in FIG. 3) of the first substrate 22. Two electronic components 35, 36 corresponding to the winding groups of the two systems are mounted on a second surface (a lower surface in FIG. 3) of the first substrate 22. The electronic components 35, 36 are respectively microcomputers. The six electronic components 31 to 36 generate heat due to the operations thereof. Note that the first surface of the first substrate 22 is a side surface of the first substrate 22, which is located on the side opposite to the motor 11, and that the second surface of the first substrate 22 is a side surface of the first substrate 22, which is located on the motor 11-side.

The electronic components 31 to 36 are arranged in an orthogonal grid as viewed in the direction perpendicular to the first substrate 22. Specifically, the electronic component 31, the electronic component 35, and the electronic component 33 are arranged along the same straight line L1 as viewed in the direction perpendicular to the first substrate 22, and the electronic component 32, the electronic component 36, and the electronic component 34 are arranged along the same straight line L2 as viewed in the direction perpendicular to the first substrate 22. The straight line L1 and the straight line L2 are parallel to each other. Further, as viewed in the direction perpendicular to the first substrate 22, the two electronic components 31, 32 are arranged in the direction perpendicular to the straight lines L1, L2, the two electronic components 35, 36 are arranged in the direction perpendicular to the straight lines L1, L2, and the two electronic components 33, 34 are arranged in the direction perpendicular to the straight lines L1, L2.

As illustrated in FIG. 2, the second substrate 23 is housed in the second substrate housing portion 21b of the heat sink 21. The second substrate 23 is fixed to an inner bottom surface of the second substrate housing portion 21b. The second substrate 23 is provided with electronic components configured to supply the electric power to the motor 11 through the control performed by the first substrate 22. The second substrate 23 is a so-called power substrate.

Figure 4:
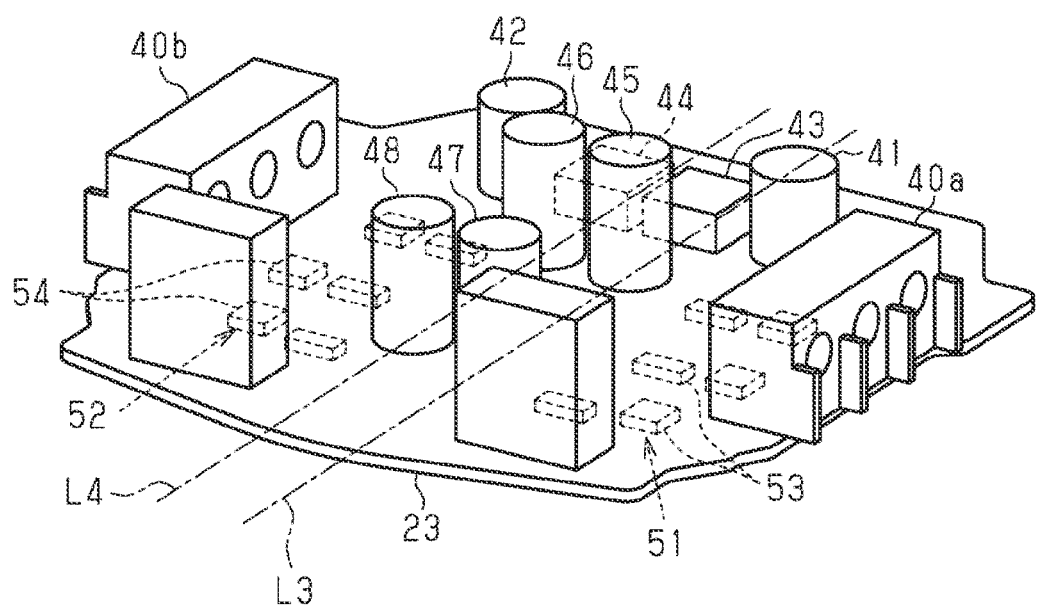
FIG. 4 is a perspective view of a second substrate in the embodiment.

As illustrated in FIG. 4, two terminal blocks 40a, 40b corresponding to the winding groups of the two systems are mounted on a first surface (an upper surface in FIG. 4) of the second substrate 23. Each of the terminal blocks 40a, 40b has a rectangular parallelepiped shape. The terminal blocks 40a, 40b are respectively disposed in two side edge portions of the second substrate 23, the two side edge portions being located on the sides opposite to each other.

A plurality of (herein, eight) electronic components 41 to 48 such as electrolytic capacitors corresponding to the winding groups of the two systems is mounted on the first surface of the second substrate 23. The electronic components 41 to 48 are disposed in the central portion, between the two terminal blocks 40a, 40b, in the first surface of the second substrate 23. As viewed in the direction perpendicular to the second substrate 23, the three electronic components 43, 45, 47 are located on the same straight line L3 extending along the direction perpendicular to the facing direction in which the two terminal blocks 40a, 40b face each other. As viewed in the direction perpendicular to the second substrate 23, the three electronic components 44, 46, 48 are located on the same straight line L4 extending along the direction perpendicular to the facing direction in which the two terminal blocks 40a, 40b face each other.

As viewed in the direction perpendicular to the second substrate 23, the two electronic components 41, 42 are disposed such that the two electronic components 43, 44 are located between the electronic components 41, 42. As viewed in the direction perpendicular to the second substrate 23, the four electronic components 41 to 44 are arranged along the facing direction in which the two terminal blocks 40a, 40b face each other. The two electronic components 45, 46 are arranged in the facing direction in which the two terminal blocks 40a, 40b face each other, and the two electronic components 47, 48 are arranged in the facing direction in which the two terminal blocks 40a, 40b face each other.

Each of the eight electronic components 41 to 48 is a so-called tall component that is taller than the chip electronic components. The heights of the four electronic components 45 to 48 among the eight electronic components 41 to 48 are greater than the heights of the remaining four electronic components 41 to 44. The heights of the electronic components 41 to 48 refer to the heights from the first surface of the second substrate 23.

As illustrated by broken lines in FIG. 4, two inverter circuits 51, 52 corresponding to the winding groups of the two systems are mounted on a second surface (a lower surface in FIG. 4) of the second substrate 23. The inverter circuit 51 is disposed close to the terminal block 40a in the second substrate 23. The inverter circuit 52 is disposed close to the terminal block 40b in the second substrate 23. Specifically, as viewed in the direction perpendicular to the second substrate 23, the two inverter circuits 51, 52 are respectively disposed on the second substrate 23 at a portion between the terminal block 40a and the electronic component group (43 to 48) and at a portion between the terminal block 40b and the electronic component group (43 to 48). The inverter circuit 51 includes a plurality of field effect transistors (FETs) 53. The inverter circuit 52 also includes a plurality of FETs 54. The two inverter circuits 51, 52 generate heat due to the operations thereof. The FETs 53, 54 are chip electronic components. A rotation angle sensor (not illustrated) configured to detect the rotation of the motor 11 is disposed at the center of the second surface (the lower surface in FIG. 4) of the second substrate 23.

As illustrated in FIG. 2, the cover 24 is attached to the side surface of the heat sink 21, which is located on the side opposite to the motor 11. The cover 24 is integrally made of a synthetic resin material. The cover 24 covers and closes the first substrate housing portion 21a of the heat sink 21. The first substrate 22 is fixed to an inner bottom portion of the cover 24.

As illustrated in FIG. 1, two connector fitting portions 24a, 24b corresponding to the winding groups of the two systems are mounted on a side surface (an upper surface in FIG. 1) of the cover 24, which is located on the side opposite to the heat sink 21. Each of the connector fitting portions 24a, 24b has a rectangular tubular shape, and the connector fitting portions 24a, 24b are open to the side opposite to the heat sink 21. Plug connectors are respectively fitted to the two connector fitting portions 24a, 24b. Each of the plug connectors is provided at a second end portion of a wire having a first end portion connected to a direct current power supply such as a battery. The direct current power from the direct current power supply is supplied to the first substrate 22 and the second substrate 23 through power supply terminals respectively provided in the two connector fitting portions 24a, 24b.

The electronic component 35 that is the first microcomputer provided on the first substrate 22 generates a switching command for the inverter circuit 51 on the second substrate 23 based on the rotation angle of the motor 11 detected by the rotation angle sensor. The FETs 53 of the inverter circuit 51 are switched based on the switching command generated by the electronic component 35 that is the microcomputer so that the direct current power supplied from the direct current power supply is converted to three-phase alternating current power. The alternating current power generated by the inverter circuit 51 is supplied to the first winding group of the motor 11 through busbars serving as power supply paths.

The electronic component 36 that is the second microcomputer provided on the first substrate 22 generates a switching command for the inverter circuit 52 of the second substrate 23 based on the rotation angle of the motor 11 detected by the rotation angle sensor. The FETs 54 of the inverter circuit 52 are switched based on the switching command generated by the electronic component 36 so that the direct current power supplied from the direct current power supply is converted to three-phase alternating current power. The alternating current power generated by the inverter circuit 52 is supplied to the second winding group of the motor 11 through busbars serving as power supply paths.

As illustrated in FIG. 1, busbars 61 for three phases corresponding to the first winding group of the motor 11 and busbars 62 for three phases corresponding to the second winding group of the motor 11 are provided to protrude from an end surface 11a of the motor 11, the end surface 11a being located on the side where the control device 12 is attached. The busbars 61 and the busbars 62 are respectively disposed in two side edge portions of the end surface 11a of the motor 11, the two side edge portions being located on the sides opposite to each other. The three busbars 61 are arranged to be upright in a row along the corresponding side edge portion of the end surface 11a. The three busbars 62 are also arranged to be upright in a row along the corresponding side edge portion of the end surface 11a. The busbars 61 are provided so as to correspond to the terminal block 40a. The busbars 62 are provided so as to correspond to the terminal block 40b.

Figure 5:
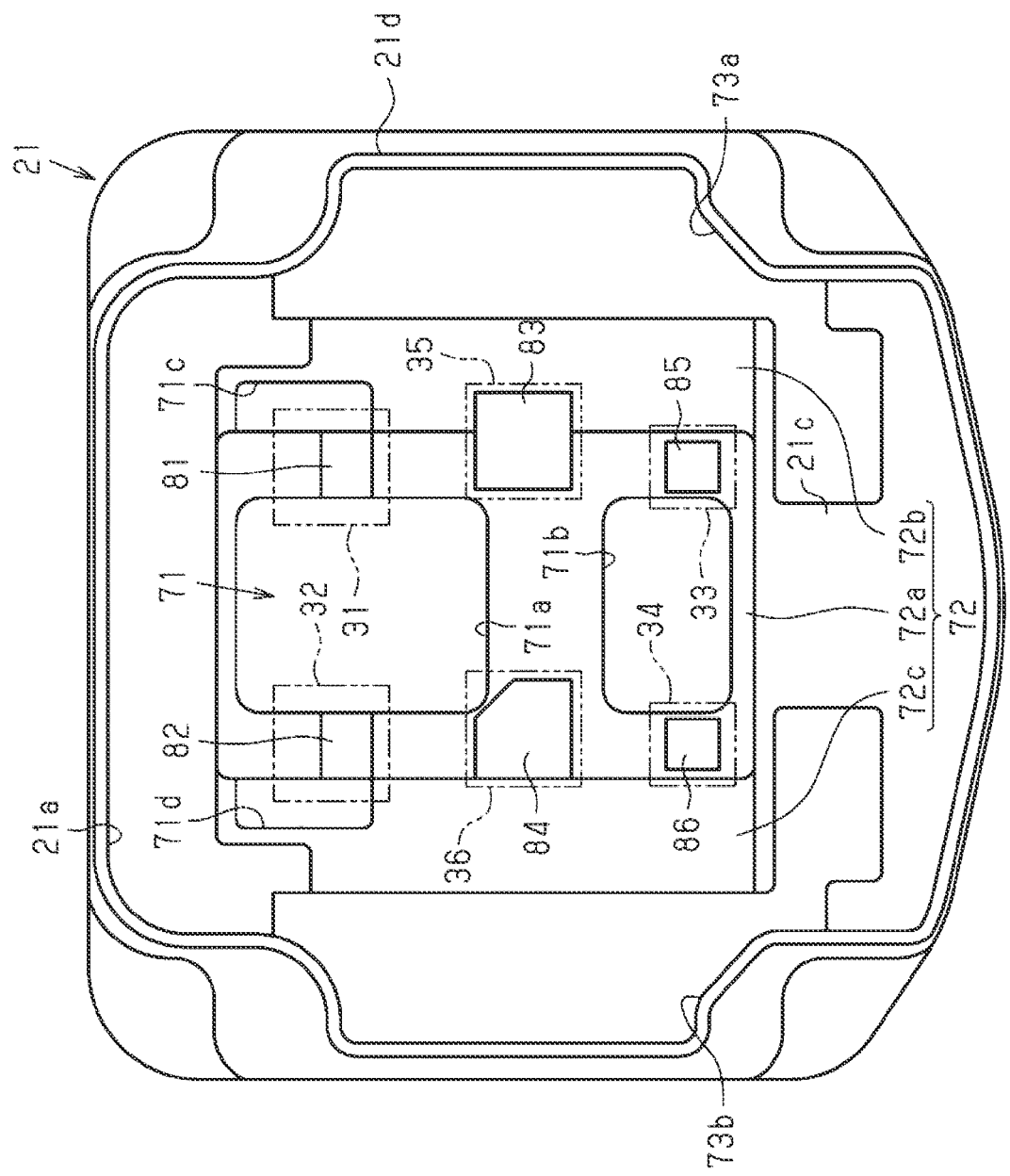
FIG. 5 is a plan view of a heat sink as viewed from the first substrate housing portion-side in the embodiment.
Figure 7:
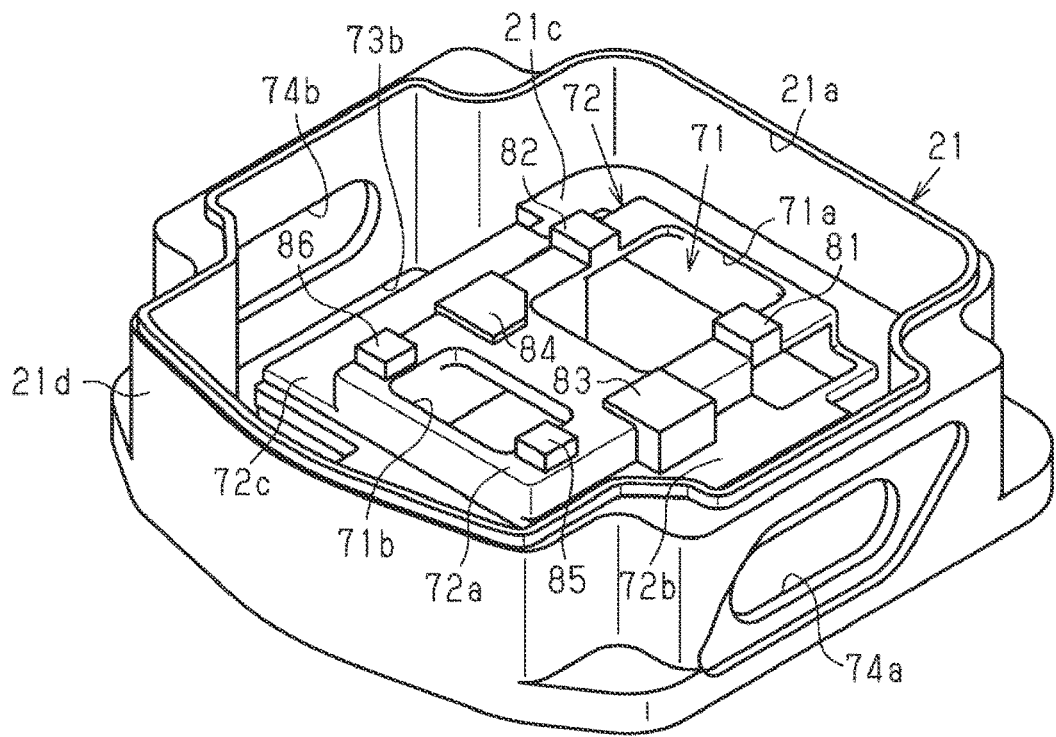
FIG. 7 is a perspective view of the heat sink as viewed from the first substrate housing portion-side in the embodiment.

Next, the configuration of the heat sink 21 will be described in detail. As illustrated in FIGS. 5 and 7, the heat sink 21 includes a component receiving portion 71 and a heat dissipation portion 72. The component receiving portion 71 is provided in the vicinity of the center of a partition wall 21c defining the first substrate housing portion 21a and the second substrate housing portion 21b in the heat sink 21. The heat dissipation portion 72 is provided around the component receiving portion 71 in the partition wall 21c. The partition wall 21c is provided with two terminal block insertion holes 73a, 73b as terminal block insertion portions. The two terminal block insertion holes 73a, 73b are respectively located on the sides opposite to each other such that the component receiving portion 71 and the heat dissipation portion 72 are located between the terminal block insertion holes 73a, 73b. The two terminal block insertion holes 73a, 73b extend along a peripheral wall 21d of the heat sink 21. The two terminal block insertion holes 73a, 73b respectively correspond to the two terminal blocks 40a, 40b provided on the second substrate 23. As illustrated in FIG. 7, in the peripheral wall 21d of the heat sink 21, openings 74a, 74b are respectively provided at positions corresponding to the two terminal block insertion holes 73a, 73b.

As illustrated in FIGS. 5 and 7, the component receiving portion 71 includes a first component receiving portion 71a and a second component receiving portion 71b. Each of the first component receiving portion 71a and the second component receiving portion 71b is a portion provided with a rectangular hole extending through the partition wall 21c. The opening area of the first component receiving portion 71a is set so as to receive the four electronic components 43 to 46 (see FIG. 4) provided on the second substrate 23. The opening area of the second component receiving portion 71b is set so as to receive the two electronic components 47, 48 (see FIG. 4) provided on the second substrate 23.

The heat dissipation portion 72 includes a first heat dissipation portion 72a, a second heat dissipation portion 72b, and a third heat dissipation portion 72c. The first heat dissipation portion 72a is a rectangular wall surrounding the first component receiving portion 71a and the second component receiving portion 71b. Six contact portions 81 to 86 are provided on a distal end surface of the first heat dissipation portion 72a. The contact portions 81 to 86 respectively correspond to the six electronic components 31 to 36 provided on the first substrate 22. Note that the distal end surface of the first heat dissipation portion 72a is an end surface of the first heat dissipation portion 72a, which is located on the side opposite to the partition wall 21c.

As illustrated by alternate long and two short dashes lines in FIG. 5, the two contact portions 81, 82 respectively correspond to the electronic components 31, 32, the two contact portions 83, 84 respectively correspond to the electronic components 35, 36 being the microcomputers, and the two contact portions 85, 86 respectively correspond to the electronic components 33, 34. As viewed in the direction perpendicular to the first substrate 22, the two contact portions 81, 82 and the electronic components 31, 32 respectively coincide with each other. As viewed in the direction perpendicular to the first substrate 22, the two contact portions 83, 84 and the electronic components 35, 36 respectively coincide with each other. As viewed in the direction perpendicular to the first substrate 22, the two contact portions 85, 86 and the electronic components 33, 34 respectively coincide with each other.

As illustrated in FIG. 7, the heights of the four contact portions 81, 82, 85, 86 are greater than the heights of the two contact portions 83, 84. The heights of the contact portions 81 to 86 refer to the heights from the distal end surface of the first heat dissipation portion 72a. The heights of the four contact portions 81, 82, 85, 86 are set such that the contact portions 81, 82, 85, 86 are substantially in contact with the second surface of the first substrate 22 at portions corresponding to the electronic components 31, 32, 33, 34 in the assembled state of the control device 12. The heights of the two contact portions 83, 84 are set such that the contact portions 83, 84 are respectively substantially in contact with the two electronic components 35, 36 that are the microcomputers mounted on the second surface of the first substrate 22. The heat generated by the four electronic components 31, 32, 33, 34 is transferred to the four contact portions 81, 82, 85, 86 through the first substrate 22. The heat generated by the two electronic components 35, 36 that are the microcomputers is transferred directly to the two contact portions 83, 84.

As illustrated in FIG. 5, the second heat dissipation portion 72b and the third heat dissipation portion 72c are also parts of the partition wall 21c. The second heat dissipation portion 72b is a portion between the first heat dissipation portion 72a and the terminal block insertion hole 73a in the partition wall 21c. The third heat dissipation portion 72c is a portion between the first heat dissipation portion 72a and the terminal block insertion hole 73b in the partition wall 21c.

Figure 6:
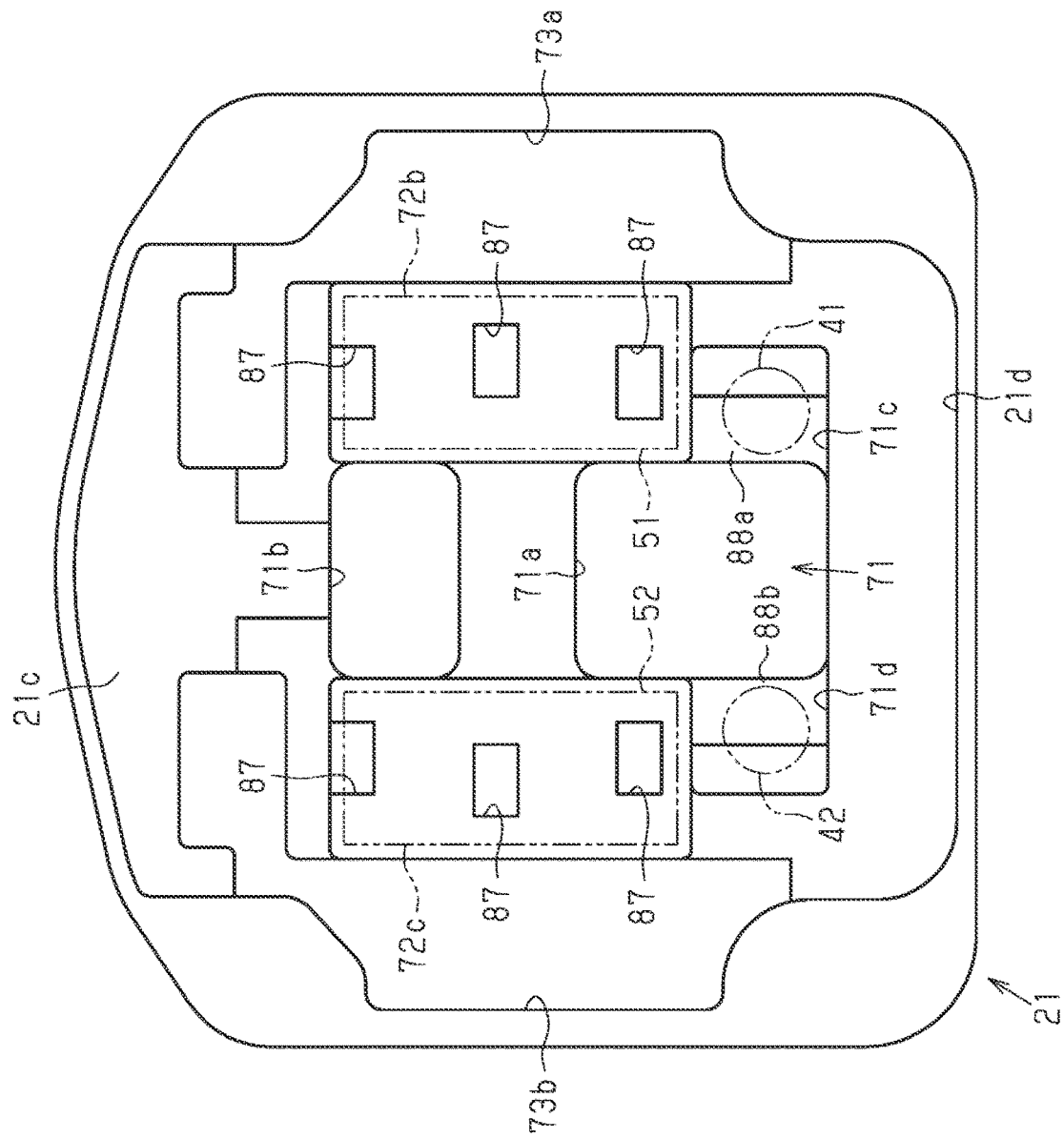
FIG. 6 is a bottom view of the heat sink as viewed from the second substrate housing portion-side in the embodiment.
Figure 8:
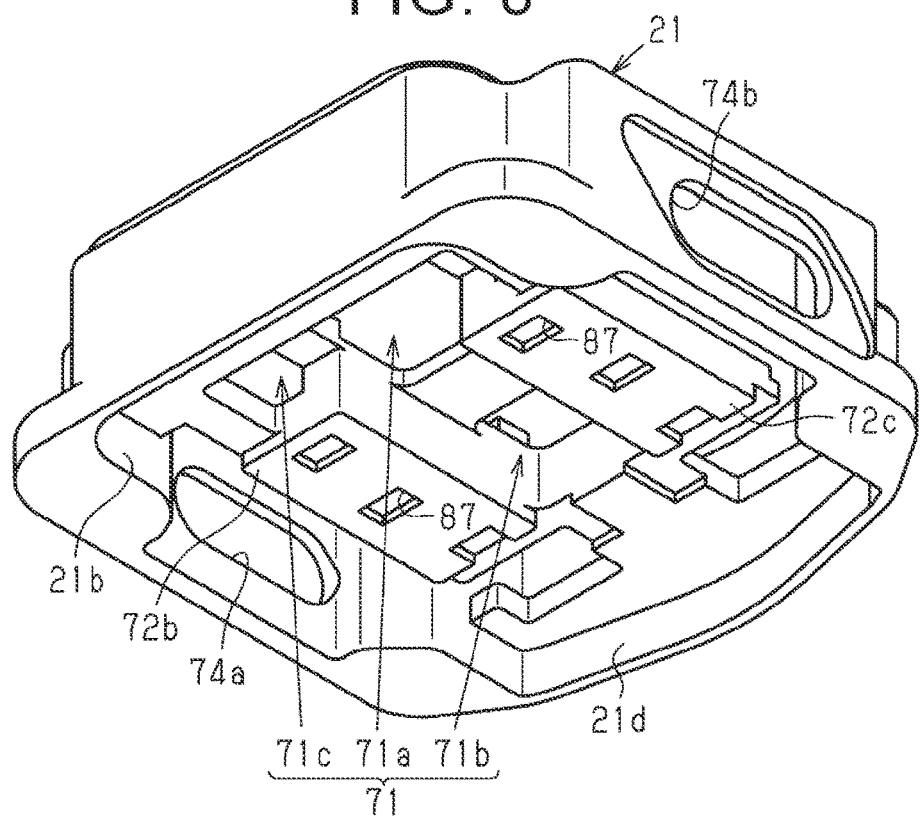
FIG. 8 is a perspective view of the heat sink as viewed from the second substrate housing portion-side in the embodiment.

As illustrated by alternate long and two short dashes lines in FIG. 6 and as illustrated in FIG. 8, when the heat sink 21 is viewed from the second substrate housing portion 21b-side, the inverter circuit 51 corresponds to the second heat dissipation portion 72b, and the inverter circuit 52 corresponds to the third heat dissipation portion 72c. In the assembled state of the control device 12, the second heat dissipation portion 72b and the third heat dissipation portion 72c are held in a state in which the second heat dissipation portion 72b and the third heat dissipation portion 72c are in proximity to or in contact with portions corresponding to the inverter circuits 51, 52 mounted on the second surface of the second substrate 23. The heat generated by the inverter circuit 51 is transferred to the second heat dissipation portion 72b through the second substrate 23. The heat generated by the inverter circuit 52 is transferred to the third heat dissipation portion 72c through the second substrate 23.

Note that heat dissipation grease excellent in thermal conductivity and electrical insulation may be applied as a heat dissipation material to side surfaces of the second heat dissipation portion 72b and the third heat dissipation portion 72c, the side surfaces being located on the second substrate 23-side (on a side of the sheet of FIG. 6, the side being close to a viewer in a direction perpendicular to a surface of the sheet). Specifically, the grease may be placed between the second heat dissipation portion 72b and the portion of the second substrate 23 where the inverter circuit 51 is provided, and between the third heat dissipation portion 72c and the portion of the second substrate 23 where the inverter circuit 52 is provided. With this configuration, the heat generated by the inverter circuits 51, 52 is transferred to the second heat dissipation portion 72b and the third heat dissipation portion 72c more efficiently.

A plurality of recesses 87 is formed in the side surfaces of the second heat dissipation portion 72b and the third heat dissipation portion 72c on the second substrate 23-side (on this side of the sheet in FIG. 6, the side being close to a viewer in the direction perpendicular to the surface of the sheet) at portions corresponding to the inverter circuits 51, 52. The recesses 87 are provided for receiving electronic components such as capacitors mounted on the first surface (the surface on the recess 87-side) of the second substrate 23 at portions corresponding to the inverter circuits 51, 52.

A third component receiving portion 71c and a fourth component receiving portion 71d forming the component receiving portion 71 are respectively provided in the side surfaces of the second heat dissipation portion 72b and the third heat dissipation portion 72c that are parts of the partition wall 21c, the side surfaces being located on the second substrate 23-side. The third component receiving portion 71c and the fourth component receiving portion 71d are recessed portions that are provided to widen a part of the first component receiving portion 71a, which is located on the side opposite to the second component receiving portion 71b, along the direction perpendicular to the direction in which the first component receiving portion 71a and the second component receiving portion 71b are arranged (along the right-left direction in FIG. 6).

That is, the third component receiving portion 71c and the fourth component receiving portion 71d communicate with the first component receiving portion 71a. The third component receiving portion 71c and the fourth component receiving portion 71d are each formed by cutting out a part of the first heat dissipation portion 72a toward the side opposite to the motor 11 (toward a side of the sheet in FIG. 6, the side being far from a viewer in the direction perpendicular to the surface of the sheet). In the second heat dissipation portion 72b and the third heat dissipation portion 72c at portions respectively corresponding to the third component receiving portion 71c and the fourth component receiving portion 71d, wall portions 88a, 88b are provided as parts of the second heat dissipation portion 72b and the third heat dissipation portion 72c.

As illustrated by alternate long and two short dashes lines in FIG. 6, the third component receiving portion 71c corresponds to the electronic component 41 on the second substrate 23, and the fourth component receiving portion 71d corresponds to the electronic component 42 on the second substrate 23. The third component receiving portion 71c and the fourth component receiving portion 71d are provided so as to receive the electronic components 41, 42 provided on the second substrate 23. In the assembled state of the control device 12, the electronic components 41, 42 on the second substrate 23 are held in a state in which the electronic components 41, 42 are in proximity to or in contact with the wall portions 88a, 88b, respectively.

Figure 9:
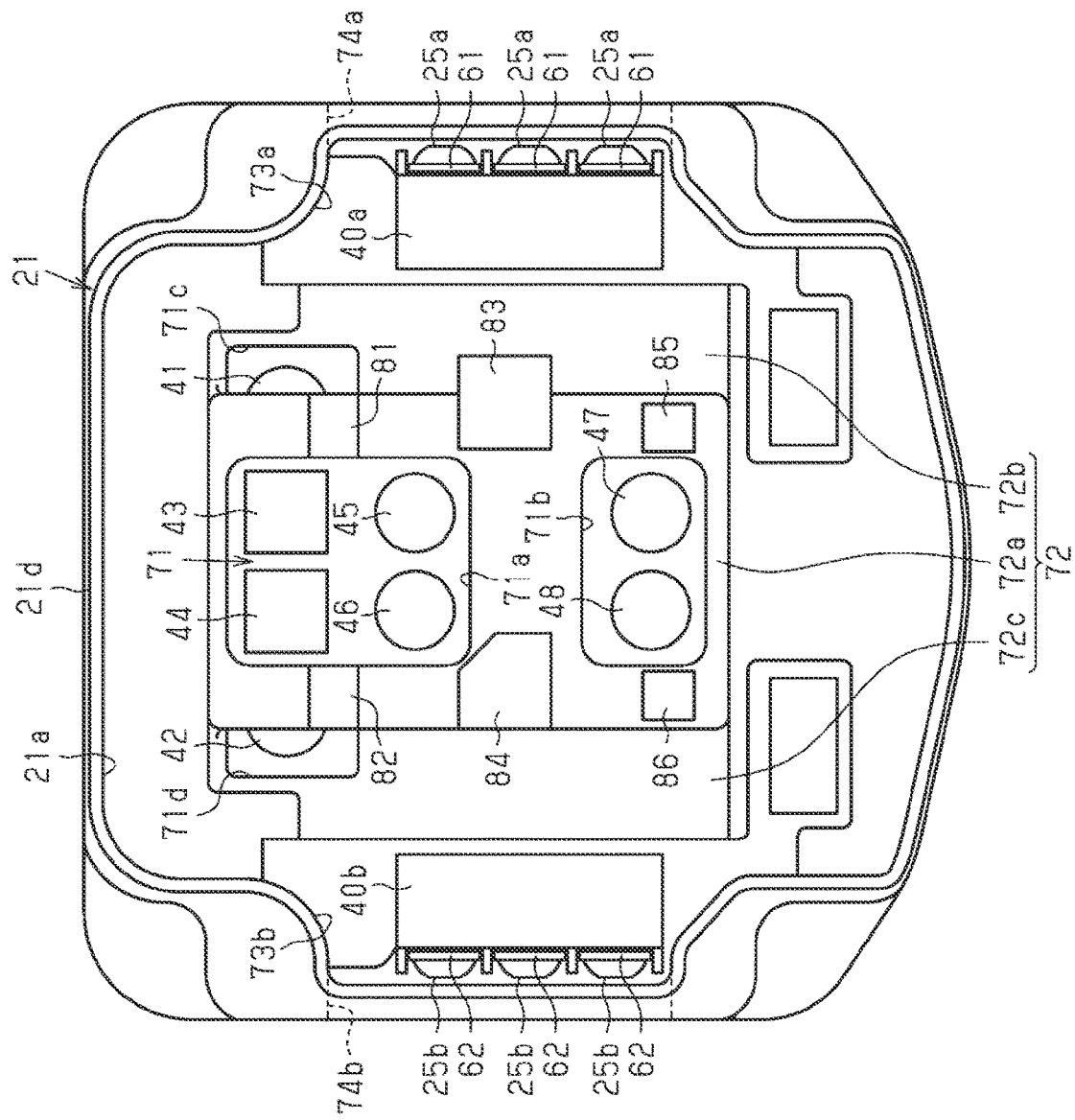
FIG. 9 is a plan view of the motor device, with a cover and the first substrate omitted, as viewed from the control device-side in the axial direction in the embodiment.

As illustrated in FIG. 9, in the state where the control device 12 is attached to the motor 11, the terminal blocks 40a, 40b on the second substrate 23 are respectively inserted in the terminal block insertion holes 73a, 73b of the heat sink 21. The terminal blocks 40a, 40b respectively face, from the inside, the openings 74a, 74b provided in the peripheral wall 21d of the heat sink 21. In the state where the control device 12 is attached to the motor 11, the busbars 61 corresponding to a first system (the first winding group) of the motor 11 are disposed between the terminal block 40a in the terminal block insertion hole 73a of the heat sink 21 and the peripheral wall 21d. The three busbars 61 are fastened to the terminal block 40a by inserting bolts 25a through the opening 74a and tightening the bolts 25a. In the state where the control device 12 is attached to the motor 11, the busbars 62 corresponding to a second system (the second winding group) of the motor 11 are disposed between the terminal block 40b in the terminal block insertion hole 73b of the heat sink 21 and the peripheral wall 21d. The three busbars 62 are fastened to the terminal block 40b by inserting bolts 25b through the opening 74b and tightening the bolts 25b. As illustrated in FIG. 1, the two openings 74a, 74b of the heat sink 21 are respectively closed by lids 26, 27.

Next, the operation of the control device 12 configured as described above will be described. The control device 12 is assembled as a subassembly separately from the motor 11, and the control device 12 assembled is attached to the end portion of the motor 11 so that the motor device 10 is obtained.

As illustrated in FIGS. 2 and 9, in the state where the control device 12 is attached to the motor 11, the four electronic components 43 to 46 on the second substrate 23 are received in the first component receiving portion 71a of the heat sink 21. Further, in the state where the control device 12 is attached to the motor 11, the two electronic components 47, 48 on the second substrate 23 are received in the second component receiving portion 71b of the heat sink 21. Further, in the state where the control device 12 is attached to the motor 11, the electronic component 41 on the second substrate 23 is received in the third component receiving portion 71c of the heat sink 21, and the electronic component 42 on the second substrate 23 is received in the fourth component receiving portion 71d of the heat sink 21. Therefore, it is possible to avoid a situation where the larger electronic components 41 to 48 provided on the second substrate 23 interfere with the heat sink 21.

Further, the larger electronic components 41 to 48 are collected in the central portion of the second substrate 23, and the component receiving portion 71 for receiving the electronic components 41 to 48 is provided in the central portion in the inside of the heat sink 21. Further, the heat dissipation portion 72 for dissipating the heat generated by the first substrate 22 and the heat generated by the second substrate 23 is provided around the component receiving portion 71 in the inside of the heat sink 21. That is, since the component receiving portion 71 and the heat dissipation portion 72 are clearly separated from each other in the heat sink 21, there is no need to cause a portion corresponding to the component receiving portion 71 in the heat sink 21 to contact with the first substrate 22 or the second substrate 23. Therefore, the component receiving portion 71 can be provided as a hole portion extending through the partition wall 21c of the heat sink 21 and providing communication between the first substrate housing portion 21a and the second substrate housing portion 21b.

Consequently, the dimension of the component receiving portion 71 in the direction in which the first substrate 22 and the second substrate 23 are arranged can be set to a required minimum dimension according to the largest electronic components 45 to 48 among the electronic components 41 to 48. Therefore, it is possible to shorten the dimension of the component receiving portion 71 in the direction in which the first substrate 22 and the second substrate 23 are arranged. Consequently, the distance between the first substrate 22 and the second substrate 23 and thus the length of the motor device 10 in its axial direction can be shortened.

Herein, it is conceivable to employ, as the heat sink 21 of a comparative example, a configuration in which the component receiving portion 71 and the heat dissipation portion 72 are not separated from each other. For example, the component receiving portion 71 is formed in a recessed shape that is open toward the second substrate housing portion 21*b*, and the first substrate 22 is in contact with a bottom portion of the component receiving portion 71 with the recessed shape as a part of a heat dissipation portion. Even with this configuration, the heat generated by the first substrate 22 can be dissipated through the bottom portion of the component receiving portion 71 with the recessed shape. However, in this case, there is a concern that the dimension of the component receiving portion 71 in the direction in which the first substrate 22 and the second substrate 23 are arranged may be increased by the thickness of the bottom portion of the component receiving portion 71 with the recessed shape. Therefore, there is a possibility that the distance between the first substrate 22 and the second substrate 23 and thus the length of the motor device 10 in its axial direction may be increased.

In this regard, in this embodiment, the component receiving portion 71 does not need to be provided with a portion that closes an opening thereof located on the first substrate 22-side and is in contact with the first substrate 22. According to this embodiment, since the component receiving portion 71 is not provided with the portion as the heat dissipation portion that is in contact with the first substrate 22, the dimension of the component receiving portion 71 can be shortened correspondingly. Consequently, the distance between the first substrate 22 and the second substrate 23 can be shortened.

Further, by providing the heat sink 21 between the first substrate 22 and the second substrate 23, the heat dissipation paths for dissipating both the heat generated by the first substrate 22 and the heat generated by the second substrate 23 are ensured. Specifically, as indicated by arrow A1 in FIG. 2, the heat generated by the electronic components provided on the first substrate 22 is transferred to the heat sink 21 directly or through the first substrate 22 so as to be dissipated. As indicated by arrow A2 in FIG. 2, the heat generated by the electronic components provided on the second substrate 23 is transferred to the heat sink 21 directly or through the second substrate 23 so as to be dissipated. As indicated by arrow A3 in FIG. 2, the heat generated by the electronic components provided on the second substrate 23 is also transferred to a housing of the motor 11. Consequently, the heat dissipation of the control device 12 is further enhanced.

Therefore, according to this embodiment, the following effects can be obtained. (1) In the heat sink 21, the component receiving portion 71 configured to receive the electronic components 41 to 48 of the second substrate 23 and the heat dissipation portion 72 configured to dissipate the heat generated by the first substrate 22 and the heat generated by the second substrate 23 are provided in a separate manner so as not to overlap with each other. Since there is no need to provide a portion that is in contact with the first substrate 22, at a portion corresponding to the component receiving portion 71 in the heat sink 21, the length of the component receiving portion 71 in the direction in which the first substrate 22 and the second substrate 23 are arranged, and thus the distance between the first substrate 22 and the second substrate 23 can be shortened correspondingly. Therefore, the length of the motor device 10 in its axial direction can be shortened. Consequently, it is possible to reduce the size of the control device 12 and thus the size of the motor device 10.

(2) Since there is no need to provide the component receiving portion 71 with a portion that is in contact with the first substrate 22, the component receiving portion 71 can be provided so as to be open to both the inside of the first substrate housing portion 21*a* and the inside of the second substrate housing portion 21*b* in the heat sink 21. Since the first substrate housing portion 21*a* and the second substrate housing portion 21*b* communicate with each other through the component receiving portion 71 in the heat sink 21, the air is circulated between the first substrate housing portion 21*a* and the second substrate housing portion 21*b*. Consequently, the heat dissipation effect of the heat sink 21 can be further enhanced.

(3) The heat sink 21 is provided between the first substrate 22 and the second substrate 23. Therefore, both the heat generated by the first substrate 22 and the heat generated by the second substrate 23 are dissipated through the heat sink 21. More specifically, the heat generated by the first substrate 22 and the heat generated by the second substrate 23 are dissipated through the partition wall 21*c* provided with the heat dissipation portion 72 and through the peripheral wall 21*d*. Consequently, the heat dissipation effect of the control device 12 is further enhanced.

(4) The heat sink 21 includes the peripheral wall 21*d* surrounding the first substrate 22 and the second substrate 23. Since the contact area between the heat sink 21 and the air is ensured, the heat dissipation effect of the heat sink 21 is further enhanced.

(5) In the heat sink 21, while the component receiving portion 71 is provided in the central portion of the heat sink 21, the heat dissipation portion 72 configured to dissipate the heat generated by the first substrate 22 and the heat generated by the second substrate 23 is provided around the component receiving portion 71. As compared to a case where the heat dissipation portion 72 is provided in the central portion of the heat sink 21, the distance between the heat dissipation portion 72 and the peripheral wall 21*d* is shortened. Therefore, the heat transferred to the heat dissipation portion 72 is transferred to the peripheral wall 21*d* and dissipated to the air more quickly. Consequently, the heat dissipation effect of the heat sink 21 can be further enhanced.

(6) The control device 12 controls the supply of electric power to the winding groups of the two systems of the motor 11. Unlike a control device for a motor having a winding group of a single system, it is necessary to provide the inverter circuits 51, 52 of the two systems. The total heat generation amount increases as the number of the inverter circuits increases. In this regard, the control device 12 of this embodiment having the higher heat dissipation effect is suitable as a control device for the motor 11 having winding groups of a plurality of systems.

(7) In the heat sink 21, the first substrate housing portion 21*a*, and the second substrate housing portion 21*b* are defined by the partition wall 21*c* and the peripheral wall 21*d*. The first substrate 22 is housed in the first substrate housing portion 21*a*, and the second substrate 23 is housed in the second substrate housing portion 21*b*. Therefore, it is possible to protect the first substrate 22 and the second substrate 23 from dust, shock, or the like.

(8) The terminal blocks 40*a*, 40*b* of the two systems to which the busbar groups of the motor 11 are connected are provided on the surface of the second substrate 23, which is located on the heat sink 21-side. In the assembled state of the control device 12, the terminal blocks 40a, 40b are held in the state in which the terminal blocks 40a, 40b are inserted in the terminal block insertion holes 73a, 73b of the heat sink 21, respectively. Therefore, as compared to the case where the terminal blocks 40a, 40b are provided on the surface of the second substrate 23, which is located on the motor 11-side, the length of the control device 12 in the direction in which the first substrate 22 and the second substrate 23 are arranged, and thus the length of the motor device 10 in its axial direction can be shortened. This is because when the terminal blocks 40a, 40b are provided on the surface of the second substrate 23, which is located on the motor 11-side, it is necessary to provide an installation space for the terminal blocks 40a, 40b between the second substrate 23 and the motor 11.

(9) When attaching the assembled control device 12 to the end portion of the motor 11, the busbar groups of the motor 11 are inserted into the terminal block insertion holes 73a, 73b of the heat sink 21, respectively. In this state, the busbar groups of the motor 11 and the terminal blocks 40a, 40b are fixed to each other by the bolts 25a, 25b from the outside through the openings 74a, 74b provided in the peripheral wall 21d of the heat sink 21. That is, since the control device 12 is assembled as a subassembly, it is possible to facilitate the assembly operation for the control device 12 and the operation of attaching the assembled control device 12 to the motor 11. Further, the control device 12 can be carried easily.

This embodiment may be modified as follows and carried out. The heat sink 21 may have a function of positioning the first substrate 22 and the second substrate 23. For example, the partition wall 21c of the heat sink 21 is provided with pins, and the pins are inserted into positioning holes provided in the first substrate 22 and the second substrate 23, respectively. With this configuration, the first substrate 22 and the second substrate 23 are positioned with respect to the heat sink 21. Consequently, the relative position accuracy of the first substrate 22 and the second substrate 23 is improved.

The positions of the component receiving portion 71 and the heat dissipation portion 72 may be reversed according to a product specification or the like. Specifically, the heat dissipation portion 72 is provided in the central portion of the heat sink 21, and the component receiving portion 71 is provided in the peripheral edge portion of the heat sink 21.

The positions of the first substrate 22 and the second substrate 23 may be reversed according to a product specification or the like. Specifically, the first substrate 22 is provided on the side close to the motor 11, and the second substrate 23 is provided on the side far from the motor 11. Note that the orientation or structure of the heat sink 21 is changed as appropriate according to the positions of the first substrate 22 and the second substrate 23.

According to a product specification or the like, a configuration may be employed in which the component receiving portion 71 does not extend through the heat sink 21. Specifically, the opening of the component receiving portion 71, which is located on the first substrate 22-side, may be closed. Note that since this closed portion does not need to function as a heat dissipation portion, there is also no need to ensure the thickness of this closed portion.

The control device 12 may be used as a control device for a motor having a winding group of a single system. In this case, the control device 12 includes an electrical component such as an inverter circuit only for the single system.

The motor device 10 is suitable as a power source of an electric power steering system. The motor device 10 is also suitable as a generation source for generating steering reaction force or a generation source for generating steering force for steering steered wheels in a steer-by-wire steering system.

The control device 12 may be embodied as a control device for an electrical device other than the motor 11.

What is claimed is:

1. A control device comprising:
    a first substrate provided with a chip electronic component;
    a second substrate having a surface provided with a plurality of electronic components including a tall component taller than the chip electronic component, the surface of the second substrate facing a surface of the first substrate, and the surface of the first substrate being provided with the chip electronic component; and
    a heat sink disposed between the first substrate and the second substrate, wherein:
        the heat sink includes a component receiving portion and a heat dissipation portion, the component receiving portion being configured to receive the tall component on the second substrate, the heat dissipation portion being configured to perform heat exchange between the first substrate and the second substrate, and the component receiving portion and the heat dissipation portion being provided so as not to overlap with each other as viewed in a facing direction in which the first substrate and the second substrate face each other,
        the component receiving portion extends through the heat sink in the facing direction in which the first substrate and the second substrate face each other,
        the component receiving portion is provided in a central portion of the heat sink, and the heat dissipation portion is provided in and the chip electronic component is provided on a peripheral portion surrounding the component receiving portion in the heat sink, and
        the heat sink includes a partition wall and a peripheral wall, the partition wall being located between the first substrate and the second substrate, and the peripheral wall being provided on a peripheral edge portion of the partition wall and surrounding both the first substrate and the second substrate.

2. The control device according to claim 1, wherein:
    the first substrate is configured to control supply of electric power to an electrical device, and the second substrate is configured to supply the electric power to the electrical device through control performed by the first substrate; and
    the second substrate is located closer to the electrical device than the first substrate is.

3. The control device according to claim 2, wherein:
    a terminal block to which a terminal of the electrical device is connected is provided on the surface of the second substrate, the surface of the second substrate being provided with the tall component; and
    the heat sink includes a terminal block receiving portion configured to receive the terminal block, the terminal block receiving portion being provided so as not to overlap with the component receiving portion or the heat dissipation portion as viewed in the facing direction in which the first substrate and the second substrate face each other.

4. A motor device comprising:
the control device according to claim 1; and
a motor as an electrical device, the motor being provided integrally with the control device.

* * * * *